(12) United States Patent
Kuo et al.

(10) Patent No.: US 11,588,078 B2
(45) Date of Patent: Feb. 21, 2023

(54) LIGHT EMITTING DEVICE AND MODULE

(71) Applicant: Lextar Electronics Corporation, Hsinchu (TW)

(72) Inventors: Shiou-Yi Kuo, Hsinchu (TW); Jian-Chin Liang, Hsinchu (TW); Yu-Chun Lee, Hsinchu (TW); Fu-Hsin Chen, Hsinchu (TW); Chih-Hao Lin, Hsinchu (TW)

(73) Assignee: Lextar Electronics Corporation, Hsinchu (TW)

(*) Notice: Subject to any disclaimer, the term of this patent is extended or adjusted under 35 U.S.C. 154(b) by 98 days.

(21) Appl. No.: 16/931,463

(22) Filed: Jul. 17, 2020

(65) Prior Publication Data
US 2022/0020900 A1 Jan. 20, 2022

(51) Int. Cl.
| | | |
|---|---|---|
| H01L 33/50 | (2010.01) | |
| H01L 33/22 | (2010.01) | |
| H01L 33/48 | (2010.01) | |
| H01L 33/62 | (2010.01) | |
| H01L 27/15 | (2006.01) | |

(52) U.S. Cl.
CPC .......... *H01L 33/504* (2013.01); *H01L 27/156* (2013.01); *H01L 33/22* (2013.01); *H01L 33/486* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 8,759,125 B2 | 6/2014 | Tischler | |
| 9,024,353 B2 | 5/2015 | Katayama et al. | |
| 9,184,351 B2 | 11/2015 | Tischler | |
| 9,831,387 B2 | 11/2017 | Chu | |
| 9,954,028 B2 | 4/2018 | Yeon | |
| 10,158,054 B1* | 12/2018 | Lin | H01L 33/56 |
| 10,297,581 B2 | 5/2019 | Steckel et al. | |
| 10,361,248 B2 | 7/2019 | Lee | |
| 10,438,994 B2* | 10/2019 | Yeon | H01L 33/56 |
| 10,566,318 B2 | 2/2020 | Lee et al. | |
| 2012/0014091 A1 | 1/2012 | He et al. | |
| 2019/0044040 A1 | 2/2019 | Andrews | |
| 2019/0074324 A1* | 3/2019 | Kim | H01L 27/1218 |
| 2019/0229097 A1 | 7/2019 | Takeya et al. | |
| 2019/0237637 A1* | 8/2019 | Cheng | H01L 33/44 |
| 2019/0334064 A1* | 10/2019 | Pourquier | H01L 33/504 |
| 2019/0347979 A1 | 11/2019 | Ahmed | |
| 2020/0105983 A1* | 4/2020 | Lim | A61L 2/10 |
| 2022/0005984 A1* | 1/2022 | Liao | H01L 25/0753 |

FOREIGN PATENT DOCUMENTS

| | | |
|---|---|---|
| TW | I603508 B | 10/2017 |
| TW | 201947303 A | 12/2019 |
| WO | 2019124883 A1 | 6/2019 |

* cited by examiner

*Primary Examiner* — Robert K Carpenter
(74) *Attorney, Agent, or Firm* — CKC & Partners Co., LLC

(57) ABSTRACT

A light emitting device includes an LED die and a wavelength conversion layer. The LED die has a light emitting top surface and light emitting side surfaces. The wavelength conversion layer contains quantum dots and a photosensitive material, and is located on the light emitting top surface. A light emitting module including multiple light emitting devices is also disclosed.

18 Claims, 3 Drawing Sheets

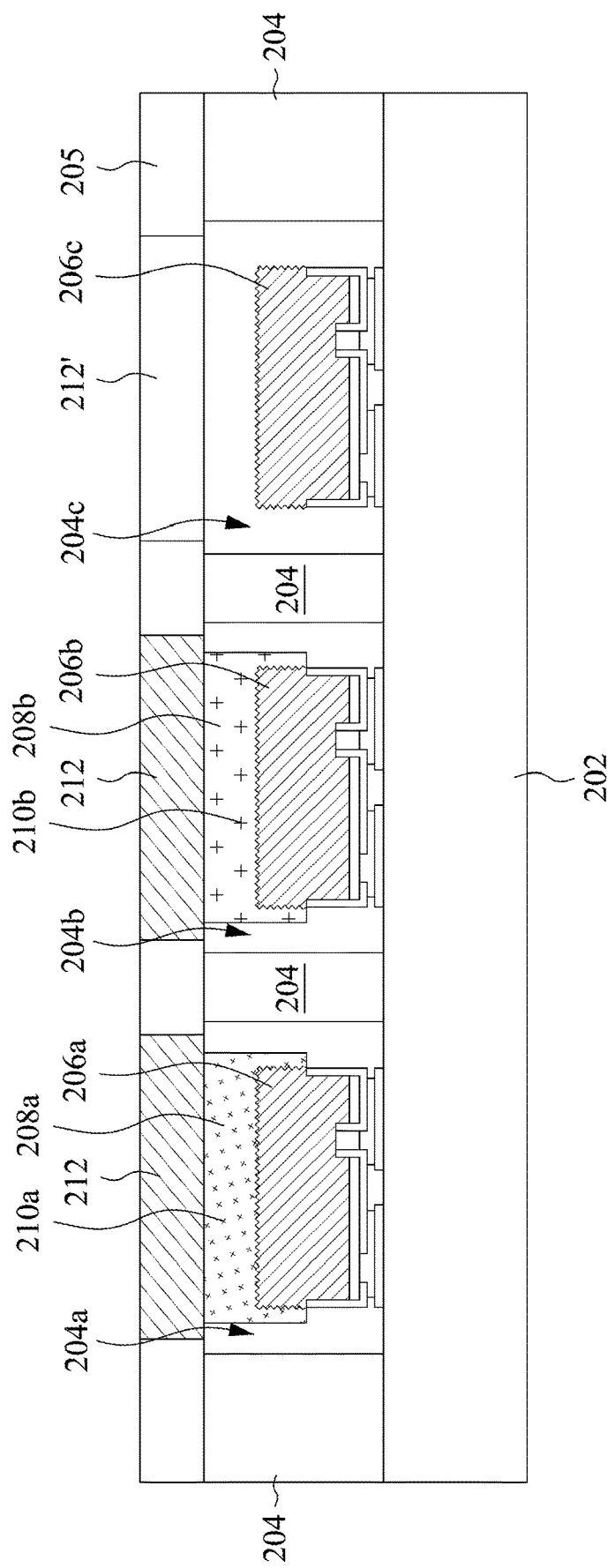

LIGHT EMITTING DEVICE AND MODULE

BACKGROUND

Field of Invention

The present disclosure relates to a light emitting device.

Description of Related Art

Light emitting diode is a light-emitting element made of semiconductor material that can convert electrical energy into light. It has the advantages of small size, high energy conversion efficiency, long life, power saving, etc., so it can be widely used as light source in various electronic applications.

When the light-emitting diodes are used as a display pixel of a display screen, it is urgent to configure multiple LEDs to properly emit lights of various colors.

SUMMARY

One aspect of the present disclosure is to provide a light emitting device includes an LED die and a wavelength conversion layer. The LED die has a light emitting top surface and light emitting side surfaces. The wavelength conversion layer contains quantum dots and a photosensitive material, and is located on the light emitting top surface.

In one or more embodiments, the wavelength conversion layer is further extended partially over the light emitting side surfaces.

In one or more embodiments, the wavelength conversion layer is further extended over all of the light emitting side surfaces.

In one or more embodiments, the LED die has a thickness equal to or less than 20 microns.

In one or more embodiments, the wavelength conversion layer has a thickness equal to or less than 20 microns.

In one or more embodiments, the light emitting top surface is a roughened surface.

In one or more embodiments, the light emitting side surfaces are roughened surfaces.

Another aspect of the present disclosure is to provide a light emitting module including a substrate and a first blue LED die, a second blue LED die and a third blue LED die on the substrate. A first wavelength conversion layer contains red quantum dots and a photosensitive material, and is located over the first blue LED die such that the red quantum dots are excited to emit red lights. A second wavelength conversion layer contains green quantum dots and the photosensitive material, and is located over the second blue LED die such that the green quantum dots are excited to emit green lights. A first blue color filter layer is located over the first wavelength conversion layer, and aligned with both the first wavelength conversion layer and the first blue LED die. A second blue color filter layer is located over the second wavelength conversion layer, and aligned with both the second wavelength conversion layer and the second blue LED die.

In one or more embodiments, the first blue color filter layer and the second blue color filter layer are not presented over the third blue LED die.

In one or more embodiments, the first, second and third blue LED dies are configured as a display pixel.

In one or more embodiments, the first wavelength conversion layer is at least located over a light emitting top surface of the first blue LED die.

In one or more embodiments, the second wavelength conversion layer is at least located over a light emitting top surface of the second blue LED die.

Still another aspect of the present disclosure is to provide a light emitting module including a substrate, a first LED die, a second LED die and a third LED die on the substrate. A first wavelength conversion layer contains red quantum dots and a photosensitive material, and is located over the first LED die such that the red quantum dots are excited to emit red lights. A second wavelength conversion layer contains green quantum dots and the photosensitive material, and is located over the second LED die such that the green quantum dots are excited to emit green lights. A color filter layer is formed over the first, second and third LED dies, and configured to filter out the lights emitted from the first and second LED dies and to pass the light emits from the third LED die.

In one or more embodiments, the third LED die is configured to emit blue light.

In one or more embodiments, the first and second LED dies are configured to emit ultraviolet lights.

In one or more embodiments, the color filter layer is configured to filter out ultraviolet lights.

In one or more embodiments, the first, second and third LED dies are configured as a display pixel.

In one or more embodiments, the first wavelength conversion layer is at least located over a light emitting top surface of the first LED die.

In one or more embodiments, the second wavelength conversion layer is at least located over a light emitting top surface of the second LED die.

In summary, the light emitting device disclosed herein provides an LED die having a wavelength conversion layer containing quantum dots mixed with a photosensitive material and coated over a top emitting surface and a side emitting surface to enhance light conversion rate by photolithography. The QD coating is performed over LED dies before mass transferring rather than a conventional QD coating performed after mass transferring. Quantum dots can be greatly saved because an interval between adjacent LED dies before mass transferring is smaller than an interval between adjacent LED dies after mass transferring. The QD coating can cover partially or overall of the side emitting surface of the LED die according to actual demands. Multiple LED dies with quantum-dot conversion layer can be configured as a light emitting module to serve as a display pixel.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3 illustrates a cross-sectional view of a light emitting module including multiple light emitting devices in accordance with another embodiment of the present disclosure.

DETAILED DESCRIPTION

Figure 2:
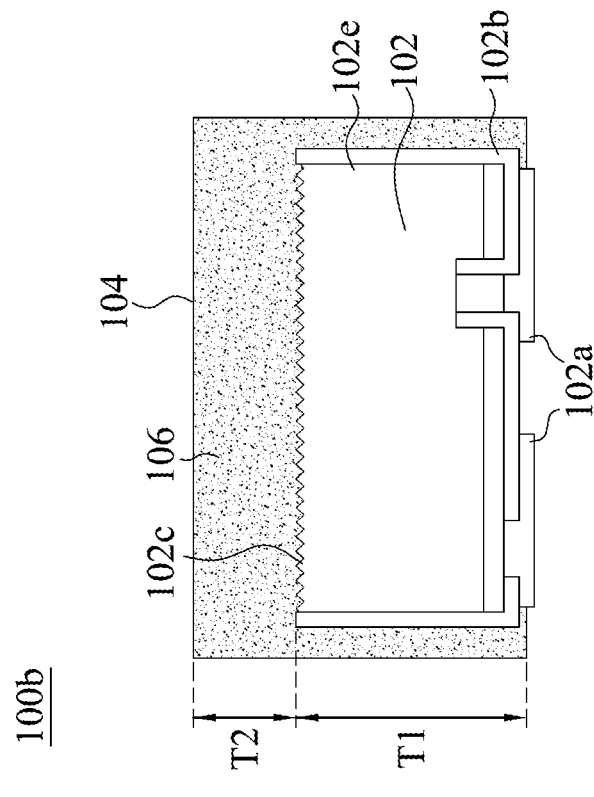
FIG. 2 illustrates a cross-sectional view of a light emitting device in accordance with another embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not necessarily be drawn to scale, and the identical elements of the embodiments are designated with the same reference numerals.

Figure 1:
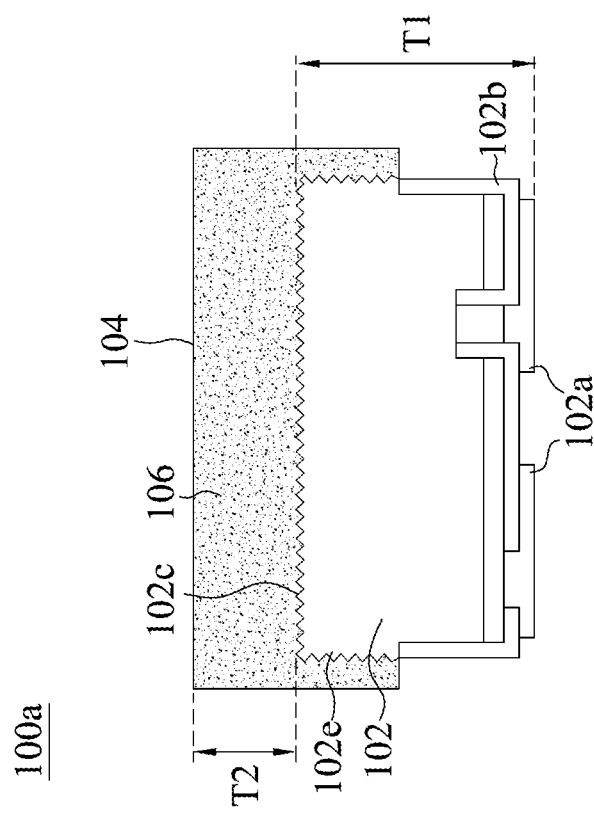
FIG. 1 illustrates a cross-sectional view of a light emitting device in accordance with an embodiment of the present disclosure.

Referring to FIG. 1, which illustrates a cross-sectional view of a light emitting device in accordance with an embodiment of the present disclosure. A light emitting device 100a includes an LED die 102 having a light emitting top surface 102c and light emitting side surfaces 102e. A wavelength conversion layer 104 may include a photosensitive material and quantum dots 106. In some embodiments, the photo-sensitive material includes a resin and a photoinitiator, and the resin may be unsaturated polyester resin (UPR), epoxy acrylate, polyurethane-acrylate (PUA), polyhydroxystyrene (PHS) or cycloaliphatic acrylate, and the photoinitiator may be α-hydroxy ketone, acrylphosphine oxide, α-amino ketone, catonic photoinitiator, oxime ester, or photo acid generator (PAG). In some embodiments, the wavelength conversion layer 104 may be formed on the light emitting top surface 102c of the LED die 102. In other embodiments, the wavelength conversion layer 104 may be formed on the light emitting top surface 102c and at least part of the light emitting side surfaces 102e of the LED die 102.

In this embodiment, the LED die 102 may be a micro LED that has a thickness T1 equal to or less than 20 microns, but not being limited thereto.

In this embodiment, the LED die 102 may be a micro LED that is free from a native support substrate, e.g., the native support substrate is removed, but not being limited thereto.

In this embodiment, the wavelength conversion layer 104 may have a thickness T2 equal to or less than 20 microns, but not being limited thereto.

In this embodiment, the LED die 102 may have its light emitting top surface 102c and light emitting side surfaces 102e as roughened surfaces to enhance the light extraction efficiency, but not being limited thereto.

In this embodiment, the LED die 102 may have an electrical insulation layer 102b to cover over a sidewall thereof as a passivation layer. The LED die 102 may also have electrical contacts 102a to be bonded to electrodes of a substrate.

Referring to FIG. 2, which illustrates a cross-sectional view of a light emitting device in accordance with another embodiment of the present disclosure. The light emitting device 100b is different from the light emitting device 100a in that the wavelength conversion layer 104 may be formed over the light emitting top surface 102c and all or full areas of the light emitting side surfaces 102e of the LED die 102.

Referring to FIG. 3, which illustrates a cross-sectional view of a light emitting module including multiple light emitting devices in accordance with another embodiment of the present disclosure. The light emitting module 200a includes a first blue LED die 206a, a second blue LED die 206b and a third blue LED die 206c installed on a substrate 202. These three blue LED dies (206a, 206b, 206c) are configured as a display pixel. Sidewalls 204 are formed on the substrate 202 to surround each of the three blue LED dies (206a, 206b, 206c) to form chambers (204a, 204b, 204c). The sidewalls 204 may be made from opaque materials that prevent lights emitted by three blue LED dies (206a, 206b, 206c) from being mixed. A top cover 205 may be formed over the sidewalls 204 and the chambers (204a, 204b, 204c).

A first wavelength conversion layer 208a may include a photosensitive material and red quantum dots 210a, and be formed over the first blue LED die 206a such that the red quantum dots 210a are excited by blue lights of the first blue LED die 206a to emit red lights. A first blue color filter layer 212 may be formed in an opening of the top cover 205 above the first wavelength conversion layer 208a, and vertically aligned with both the first wavelength conversion layer 208a and the first blue LED die 206a to serve as a window such that red lights can be emitted from the window and blue lights emitted from the first blue LED die 206a can be filtered out.

A second wavelength conversion layer 208b may include a photosensitive material and green quantum dots 210b, and be formed over the second blue LED die 206b such that the green quantum dots 210b are excited by blue lights of the second blue LED die 206b to emit green lights. A second blue color filter layer 212 may be formed in an opening of the top cover 205 above the second wavelength conversion layer 208b, and vertically aligned with both the second wavelength conversion layer 208b and the second blue LED die 206b to serve as a window such that green lights can be emitted from the window and blue lights emitted from the second blue LED die 206b can be filtered out.

A window 212' may be formed in an opening of the top cover 205 above the third blue LED die 206c such that blue lights emitted from the third blue LED die 206c can be output. No blue color filter layer is presented within the window 212'.

In some embodiments, the first wavelength conversion layer 208a is at least formed over a light emitting top surface of the first blue LED die 206a. In other embodiments, the first wavelength conversion layer 208a may be formed over a light emitting top surface and a light emitting side surface of the first blue LED die 206a to further enhance light conversion rate.

Similarly, in some embodiments, the second wavelength conversion layer 208b is at least formed over a light emitting top surface of the second blue LED die 206b. In other embodiments, the second wavelength conversion layer 208b may be formed over a light emitting top surface and a light emitting side surface of the second blue LED die 206b to further enhance light conversion rate.

Similarly, three blue LED dies (206a, 206b, 206c) may have their light emitting top surfaces and light emitting side surfaces as roughened surfaces to enhance the light extraction efficiency, but not being limited thereto.

Figure 4:
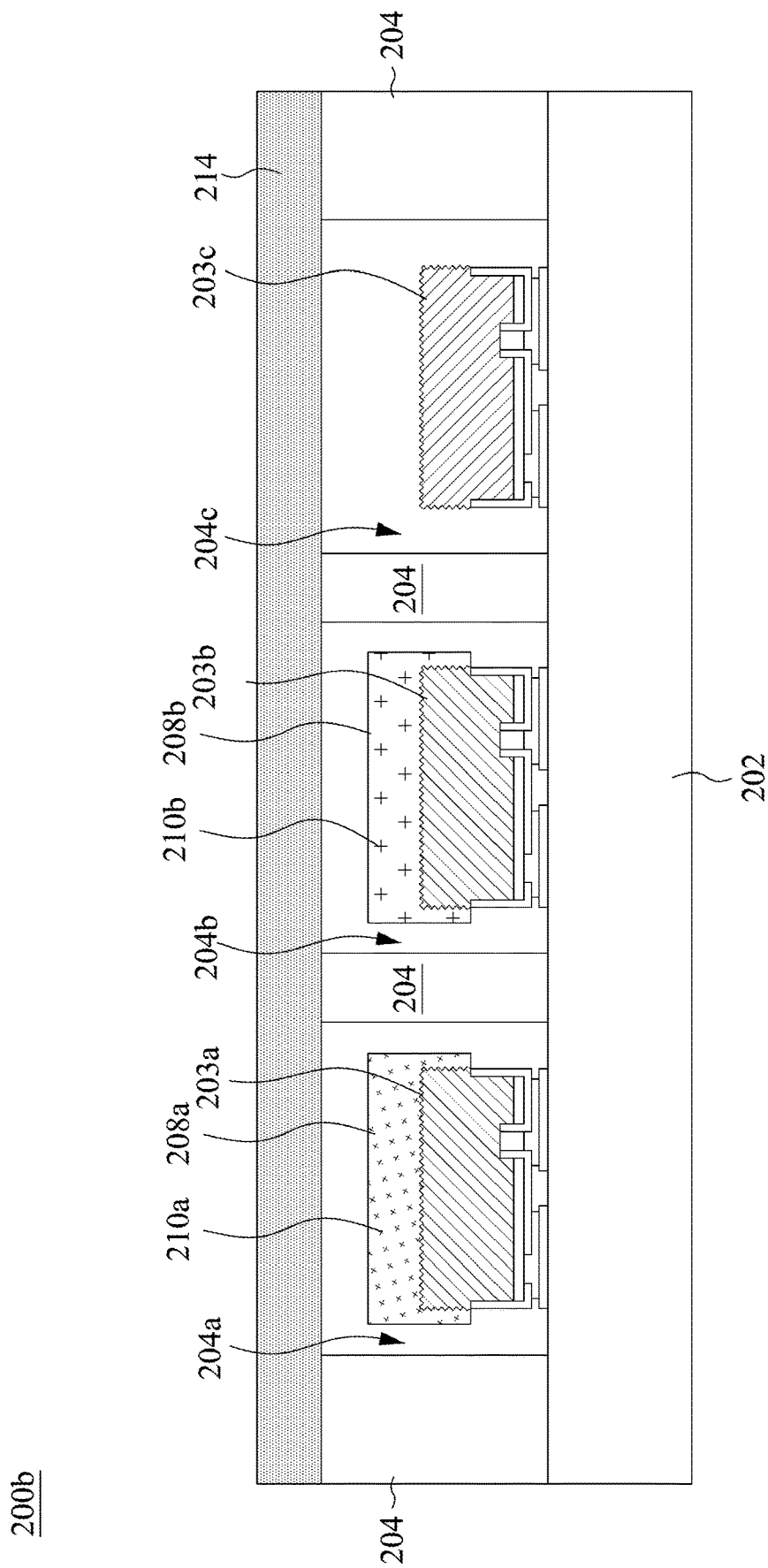
FIG. 4 illustrates a cross-sectional view of a light emitting module including multiple light emitting devices in accordance with still another embodiment of the present disclosure.

Referring to FIG. 4, which illustrates a cross-sectional view of a light emitting module including multiple light emitting devices in accordance with still another embodiment of the present disclosure. The light emitting module 200b includes a first ultraviolet LED die 203a, a second ultraviolet LED die 203b and a third blue LED die 203c installed on a substrate 202. These three LED dies (203a, 203b, 203c) are configured as a display pixel. Sidewalls 204 are formed on the substrate 202 to surround each of the three LED dies (203a, 203b, 203c) to form chambers (204a, 204b, 204c). The sidewalls 204 may be made from opaque materials that prevent lights emitted by three LED dies (203a, 203b, 203c) from being mixed.

A first wavelength conversion layer 208a may include a photosensitive material and red quantum dots 210a, and be formed over the first ultraviolet LED die 203a such that the red quantum dots 210a are excited by ultraviolet lights of the first ultraviolet LED die 203a to emit red lights. A second wavelength conversion layer 208b may include a photosensitive material and green quantum dots 210b, and be formed over the second ultraviolet LED die 203b such that the green quantum dots 210b are excited by ultraviolet lights of the second ultraviolet LED die 203b to emit green lights.

An ultraviolet color filter layer 214 may be formed over three LED dies (203a, 203b, 203c), the sidewalls 204 and the chambers (204a, 204b, 204c), and configured to filter out ultraviolet lights emitted from the first and second ultraviolet LED dies (203a, 203b) and to pass blue light emits from the third blue LED die 203c.

In some embodiments, the first wavelength conversion layer 208a is at least formed over a light emitting top surface of the first ultraviolet LED die 203a. In other embodiments, the first wavelength conversion layer 208a may be formed over a light emitting top surface and a light emitting side surface of the first ultraviolet LED die 203a to further enhance light conversion rate.

Similarly, in some embodiments, the second wavelength conversion layer 208b is at least formed over a light emitting top surface of the second ultraviolet LED die 203b. In other embodiments, the second wavelength conversion layer 208b may be formed over a light emitting top surface and a light emitting side surface of the second ultraviolet LED die 203b to further enhance light conversion rate.

Similarly, three LED dies (203a, 203b, 203c) may have their light emitting top surfaces and light emitting side surfaces as roughened surfaces to enhance the light extraction efficiency, but not being limited thereto.

In other embodiments, the first and second ultraviolet LED dies may be replaced by other LED dies that can emit proper lights to excite the red or green quantum dots. In other embodiments, the ultraviolet color filter layer may be replaced by other color filter layer that can filter out the lights emitted from the first and second LED dies and to pass the light emits from the third LED die.

In summary, the light emitting device disclosed herein provides an LED die having a wavelength conversion layer containing quantum dots (QD) mixed with a photosensitive material and coated over a top emitting surface and a side emitting surface to enhance light conversion rate by photolithography. The QD coating is performed over LED dies before mass transferring rather than a conventional QD coating performed after mass transferring. Quantum dots can be greatly saved because an interval between adjacent LED dies before mass transferring is smaller than an interval between adjacent LED dies after mass transferring. The QD coating can cover partially or overall of the side emitting surface of the LED die according to actual demands. Multiple LED dies with quantum-dot conversion layer can be configured as a light emitting module to serve as a display pixel.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A micro LED chip comprising:
   an LED die having a light emitting top surface and light emitting side surfaces; and
   a wavelength conversion layer containing quantum dots and a photosensitive material, and disposed on the light emitting top surface, wherein the wavelength conversion layer is a thin film having a thickness equal to or less than 20 microns, wherein the wavelength conversion layer is extended to cover at least a portion of the light emitting side surfaces.

2. The micro LED chip of claim 1, wherein the wavelength conversion layer is further extended to cover all of the light emitting side surfaces.

3. The micro LED chip of claim 1, wherein the LED die has a thickness equal to or less than 20 microns.

4. The micro LED chip of claim 1, wherein the light emitting top surface is a roughened surface.

5. The micro LED chip of claim 1, wherein the light emitting side surfaces are roughened surfaces.

6. A light emitting module comprising:
   a substrate;
   a first blue LED die, a second blue LED die and a third blue LED die disposed on the substrate, wherein each of the first, second and third blue LED dies has a light emitting top surface and light emitting side surfaces;
   a first wavelength conversion layer containing red quantum dots and a photosensitive material, and disposed over the first blue LED die such that the red quantum dots are excited to emit red lights, wherein the first wavelength conversion layer covers at least a portion of the light emitting side surfaces of the first blue LED die;
   a second wavelength conversion layer containing green quantum dots and the photosensitive material, and disposed over the second blue LED die such that the green quantum dots are excited to emit green lights, wherein the photosensitive material comprises a resin and a photo initiator;
   a first blue color filter layer disposed over the first wavelength conversion layer, and aligned with both the first wavelength conversion layer and the first blue LED die; and
   a second blue color filter layer disposed over the second wavelength conversion layer, and aligned with both the second wavelength conversion layer and the second blue LED die.

7. The light emitting module of claim 6, wherein the first blue color filter layer and the second blue color filter layer are not presented over the third blue LED die.

8. The light emitting module of claim 6, wherein the first, second and third blue LED dies are configured as a display pixel.

9. The light emitting module of claim 6, wherein the first wavelength conversion layer is at least disposed over a light emitting top surface of the first blue LED die.

10. The light emitting module of claim 6, wherein the second wavelength conversion layer is at least disposed over a light emitting top surface of the second blue LED die.

11. A light emitting module comprising:
   a substrate;
   a first LED die, a second LED die and a third LED die disposed on the substrate;
   a first wavelength conversion layer containing red quantum dots and a photosensitive material, and disposed over the first LED die such that the red quantum dots are excited to emit red lights;
   a second wavelength conversion layer containing green quantum dots and the photosensitive material, and disposed over the second LED die such that the green quantum dots are excited to emit green lights, wherein the photosensitive material comprises a resin and a photoinitiator; and
   a continuous color filter layer covering light emitting top surfaces of the first, second and third LED dies, and configured to filter out lights emitted from the first and second LED dies and to pass lights emitted from the third LED die.

12. The light emitting module of claim 11, wherein the third LED die is configured to emit blue light.

13. The light emitting module of claim 12, wherein the first and second LED dies are configured to emit ultraviolet lights.

14. The light emitting module of claim 13, wherein the color filter layer is configured to filter out ultraviolet lights.

15. The light emitting module of claim 11, wherein the first, second and third LED dies are configured as a display pixel.

16. The light emitting module of claim 11, wherein the first wavelength conversion layer is at least disposed over a light emitting top surface of the first LED die.

17. The light emitting module of claim 11, wherein the second wavelength conversion layer is at least disposed over a light emitting top surface of the second LED die.

18. The light emitting module of claim 11, wherein the first, second and third LED dies are configured as a display pixel, the first and second LED dies are configured to emit lights of a first wavelength range, and the third LED die is configured to emit lights of a second wavelength range different from the first wavelength range.

* * * * *